United States Patent
Cho et al.

(10) Patent No.: US 7,677,199 B2
(45) Date of Patent: Mar. 16, 2010

(54) SURFACE TREATMENT SYSTEM AND METHOD

(75) Inventors: Cheon-Soo Cho, Changwon (KR);
Dong-Sik Youn, Changwon (KR);
Hyun-Wook Lee, Gimhae (KR);
Samchul Ha, Changwon (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 10/485,900

(22) PCT Filed: Dec. 30, 2002

(86) PCT No.: PCT/KR02/02492

§ 371 (c)(1),
(2), (4) Date: Aug. 5, 2004

(87) PCT Pub. No.: WO03/083165

PCT Pub. Date: Oct. 9, 2003

(65) Prior Publication Data

US 2005/0016455 A1    Jan. 27, 2005

(30) Foreign Application Priority Data

Mar. 29, 2002    (KR) .................. 10-2002-0017518

(51) Int. Cl.
*C23C 16/50* (2006.01)
*C23C 16/509* (2006.01)
*C23C 16/458* (2006.01)
*C23C 16/52* (2006.01)
*C23C 16/06* (2006.01)
*C23C 16/22* (2006.01)

(52) U.S. Cl. .................. 118/723 E; 118/724; 118/715; 118/723 R; 156/345.27; 156/345.37; 156/345.43

(58) Field of Classification Search .............. 118/723 E, 118/723 ER, 724, 715, 723 R; 156/345.43, 156/345.27, 345.37
See application file for complete search history.

(56) References Cited

U.S. PATENT DOCUMENTS

| | | | | |
|---|---|---|---|---|
| 4,225,222 A | * | 9/1980 | Kempter | 430/57.7 |
| 4,268,374 A | * | 5/1981 | Lepselter | 204/298.31 |
| 4,404,076 A | * | 9/1983 | Nakagawa et al. | 427/578 |
| 4,491,496 A | * | 1/1985 | Laporte et al. | 156/345.47 |
| 4,534,816 A | * | 8/1985 | Chen et al. | 156/345.37 |
| 4,572,759 A | * | 2/1986 | Benzing | 156/345.45 |
| 4,612,077 A | * | 9/1986 | Tracy et al. | 156/345.34 |
| 4,633,809 A | * | 1/1987 | Hirose et al. | 118/719 |
| 4,709,656 A | * | 12/1987 | Fujiyama | 118/723 E |
| 4,719,873 A | * | 1/1988 | Fujiyama | 118/723 E |

(Continued)

FOREIGN PATENT DOCUMENTS

WO        WO9927157        6/1999

*Primary Examiner*—Rudy Zervigon
(74) *Attorney, Agent, or Firm*—Birch, Stewart, Kolasch & Birch, LLP

(57) ABSTRACT

A surface treatment system is disclosed to form a deposition layer at a surface of an object of surface treatment by using a deposition reaction in which an electrode (110) for applying power to form a deposition reaction in the deposition chamber (100) is installed between an inner wall (120) of the deposition chamber (100) and an object of surface treatment (900) and further includes a cooling unit (200) installed at the inner wall (120) of the deposition chamber (100) facing the electrode (110) and cooling ambient thereof.

12 Claims, 4 Drawing Sheets

U.S. PATENT DOCUMENTS

| | | | | |
|---|---|---|---|---|
| 4,769,303 A | * | 9/1988 | Ueno et al. | 430/64 |
| 4,772,356 A | * | 9/1988 | Schumaker et al. | 117/89 |
| 4,838,983 A | * | 6/1989 | Schumaker et al. | 117/89 |
| 4,931,135 A | * | 6/1990 | Horiuchi et al. | 216/67 |
| 4,971,653 A | * | 11/1990 | Powell et al. | 438/5 |
| 5,097,890 A | * | 3/1992 | Nakao | 165/206 |
| 5,182,093 A | * | 1/1993 | Cann | 423/446 |
| 5,273,588 A | * | 12/1993 | Foster et al. | 118/723 E |
| 5,364,488 A | * | 11/1994 | Minato et al. | 156/345.27 |
| 5,423,936 A | * | 6/1995 | Tomita et al. | 156/345.34 |
| 5,439,715 A | * | 8/1995 | Okamura et al. | 427/575 |
| 5,529,632 A | * | 6/1996 | Katayama et al. | 118/723 MP |
| 5,529,657 A | * | 6/1996 | Ishii | 156/345.26 |
| 5,567,267 A | * | 10/1996 | Kazama et al. | 156/345.27 |
| 5,618,349 A | * | 4/1997 | Yuuki | 118/715 |
| 5,647,945 A | * | 7/1997 | Matsuse et al. | 156/345.38 |
| 5,705,019 A | * | 1/1998 | Yamada et al. | 156/345.44 |
| 5,846,375 A | * | 12/1998 | Gilchrist et al. | 156/345.52 |
| 5,884,009 A | * | 3/1999 | Okase | 392/418 |
| 5,893,962 A | * | 4/1999 | Mizuno et al. | 118/723 E |
| 5,950,925 A | * | 9/1999 | Fukunaga et al. | 239/132.3 |
| 5,951,772 A | * | 9/1999 | Matsuse et al. | 118/723 R |
| 5,951,923 A | * | 9/1999 | Horie et al. | 261/153 |
| 6,077,388 A | * | 6/2000 | Freeman | 156/345.37 |
| 6,089,182 A | * | 7/2000 | Hama | 118/723 I |
| 6,110,287 A | * | 8/2000 | Arai et al. | 156/345.34 |
| 6,165,274 A | * | 12/2000 | Akiyama et al. | 118/724 |
| 6,171,438 B1 | * | 1/2001 | Masuda et al. | 156/345.27 |
| 6,209,480 B1 | * | 4/2001 | Moslehi | 118/723 I |
| 6,245,192 B1 | * | 6/2001 | Dhindsa et al. | 156/345.34 |
| 6,246,031 B1 | * | 6/2001 | Yoo | 219/390 |
| 6,251,191 B1 | * | 6/2001 | Matsuse | 118/719 |
| 6,350,497 B1 | * | 2/2002 | Murayama et al. | 427/580 |
| 6,402,849 B2 | * | 6/2002 | Kwag et al. | 118/715 |
| 6,453,992 B1 | * | 9/2002 | Kim | 165/206 |
| 6,506,686 B2 | * | 1/2003 | Masuda et al. | 438/715 |
| 6,572,934 B2 | * | 6/2003 | Watanabe et al. | 427/534 |
| 7,115,184 B2 | * | 10/2006 | Ohmi et al. | 156/345.33 |
| 7,229,666 B2 | * | 6/2007 | Mardian et al. | 427/248.1 |
| 7,252,716 B2 | * | 8/2007 | Kim et al. | 118/715 |
| 2003/0215569 A1 | * | 11/2003 | Mardian et al. | 427/248.1 |
| 2004/0050496 A1 | * | 3/2004 | Iwai et al. | 156/345.51 |
| 2004/0187785 A1 | * | 9/2004 | Kishimoto et al. | 118/719 |
| 2004/0250768 A1 | * | 12/2004 | Kikuchi et al. | 118/715 |
| 2005/0000423 A1 | * | 1/2005 | Kasai et al. | 118/715 |
| 2005/0064717 A1 | * | 3/2005 | Kanai et al. | 438/709 |
| 2005/0241765 A1 | * | 11/2005 | Dhindsa et al. | 156/345.34 |

\* cited by examiner

SURFACE TREATMENT SYSTEM AND METHOD

TECHNICAL FIELD

The present invention relates to a surface treatment system and method and, more particularly, to a surface treatment system and method for forming a deposition layer on a surface of an object using a deposition reaction.

BACKGROUND ART

In general, a surface treatment is to make a surface of a product made of a material such as a metal look good, or to improve the surface to achieve heat resistance, corrosion resistance, abrasion resistance, etc. so that the function of the product can be improved according to the condition of usage of the product. That is, the surface treatment conceals inner defects, etc. by properly treating a surface of the metal.

The surface treatment includes plating on a surface of accessory, chromium plating on brass, or a tinplating for an iron sheet, etc.

The surface treatment methods include alumite for protecting the inside of an object by surface treatment by providing an oxide layer, an anticorrosive paint coating, a chemical vapor deposition (CVD) reaction, or a physical vapor deposition (PVD) reaction.

A heat exchanger used in an air conditioner, a refrigerator, a heating apparatus, etc. is a device for transferring heat from a fluid of high temperature to a fluid of low temperature through a heat transfer wall. At this time, the flow of the fluid becomes different according to a characteristic of a surface of the heat transfer wall, and the characteristics of the surface of the heat transfer wall greatly influence the heat exchange efficiency of the heat exchanger.

Accordingly, a radiator surface of a heat exchanger is required to have a surface treatment with various characteristics according to the performance of the heat exchanger. To this end, fins of the heat exchanger are fabricated by processing a sheet having a treated surface to improve hydrophilicity, hydrophobicity, or corrosion resistance.

Also, the sheet for processing the fins of the exchanger has a surface treatment that forms a deposition layer at the surface of the sheet by using a chemical vapor deposition reaction or a physical vapor deposition reaction.

In the meantime, for the surface treatment, a reaction gas is injected in a deposition chamber and then power is applied thereto for producing a deposition reaction. A method for applying power includes a method for applying power to the object of surface treatment for the deposition reaction.

In the conventional surface treatment method represented in PCT Publication No. WO9927157, power is directly applied to the object to be surface treated, in a polymerization chamber injected by reaction gas to cause a plasma polymerization reaction, thereby forming a deposition layer at a surface of the object of surface treatment.

The deposition layer formed at the surface of the surface-processed product differs depending on chemical compositions, but the deposition layer forming process also has a great influence on the quality of the deposition layer formed at the surface of the product. The quality differs depending on the composition of gas for the deposition reaction, configuration of the deposition chamber or the like.

Consequently, a surface treatment system is needed to form a satisfactory deposition layer on the surface of an object to be surface treated.

In addition, a surface treatment system is needed to effectively process the surface of a product in line with mass surface processing.

SUMMARY OF THE INVENTION

Therefore, it is an object of the present invention to provide a surface treatment system that is capable of allowing a deposition reaction to take place only in a deposition space where a deposition layer is formed at the surface of the object to be surface treated and capable of reducing the size of a deposition chamber by additionally installing a cooling unit to cool the ambient in the deposition chamber.

To achieve these objects, there is provided a surface treatment system for forming a deposition layer at a surface of an object by using a deposition reaction in which an electrode for applying power to form a deposition reaction in the deposition chamber is installed between an inner wall of the deposition chamber and the object of surface treatment, including: a cooling unit installed at the inner wall of the deposition chamber facing the electrode and cooling the ambient environment.

To achieve the above object, there is also provided a surface treatment system in which gas for a deposition reaction is injected into a deposition chamber and power is applied to form a deposition reaction to form a deposition layer at a surface of an object, including: a gas injection unit installed at both sides of the deposition chamber, through which gas for the deposition reaction is injected into a deposition space; a gas discharge unit disposed at the center of the deposition chamber to divide the deposition space into two areas and discharging the deposition reaction-finished gas outwardly of the deposition chamber; a plurality of electrodes installed with a deposition space therebetween and applying power to the deposition chamber; and a cooling unit installed at both sides of the deposition chamber for cooling the ambient environment.

BRIEF DESCRIPTION OF THE DRAWINGS

The present invention will become more fully understood from the detailed description given hereinbelow and the accompanying drawings, which are given by way of illustration only, and thus are not limitative of the present invention, and wherein.

MODES FOR CARRYING OUT THE PREFERRED EMBODIMENTS

A surface treatment system and a surface treatment method in accordance with the present invention will now be described with reference to the accompanying drawings.

Elements other than those requisite for constituting the surface treatment system of the present invention are omitted in the specification and drawings for the simplicity purpose.

Figure 1:
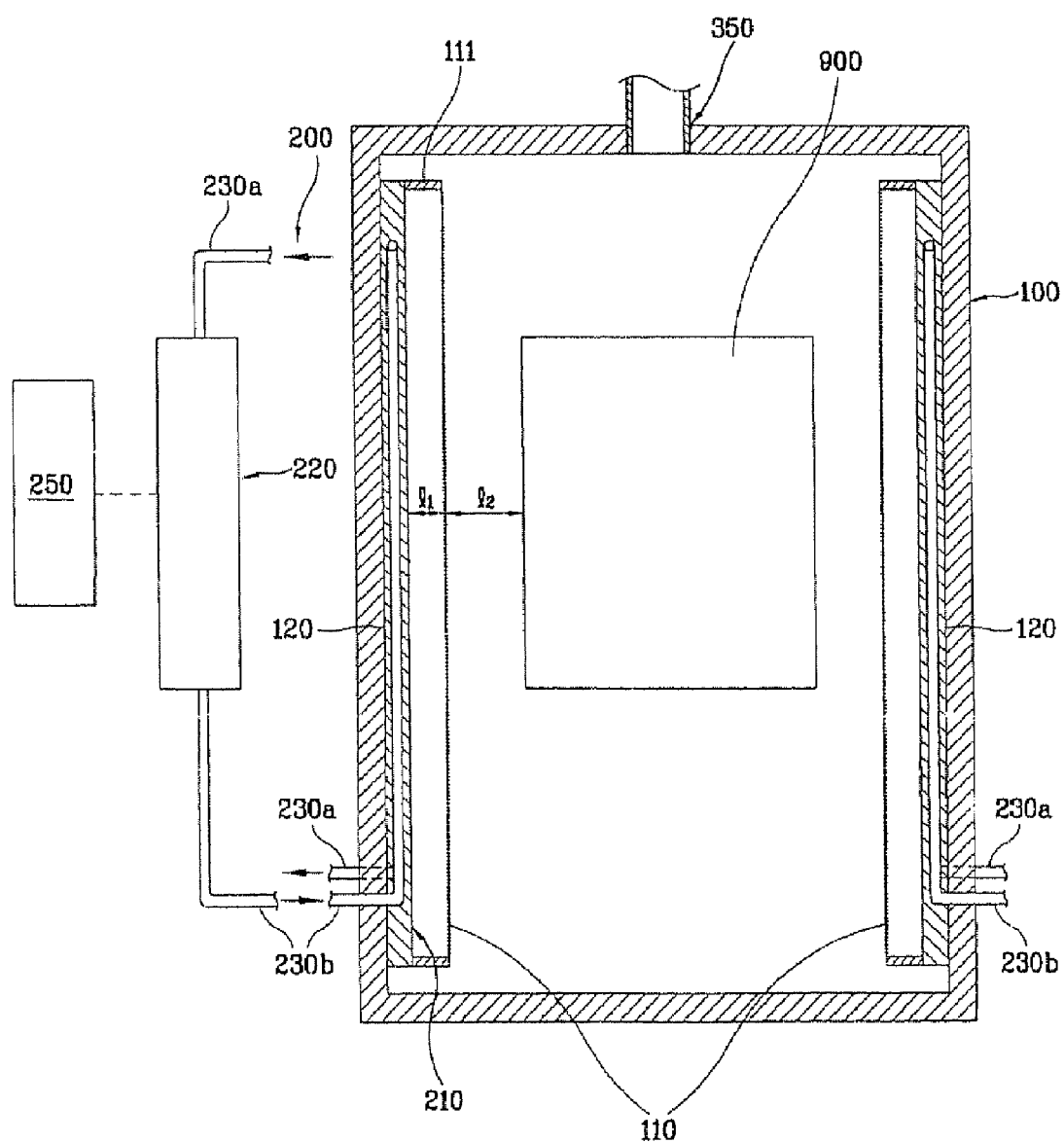
FIG. 1 is a conceptual view showing a surface treatment system in accordance with the first embodiment of the present invention.
Figure 2:
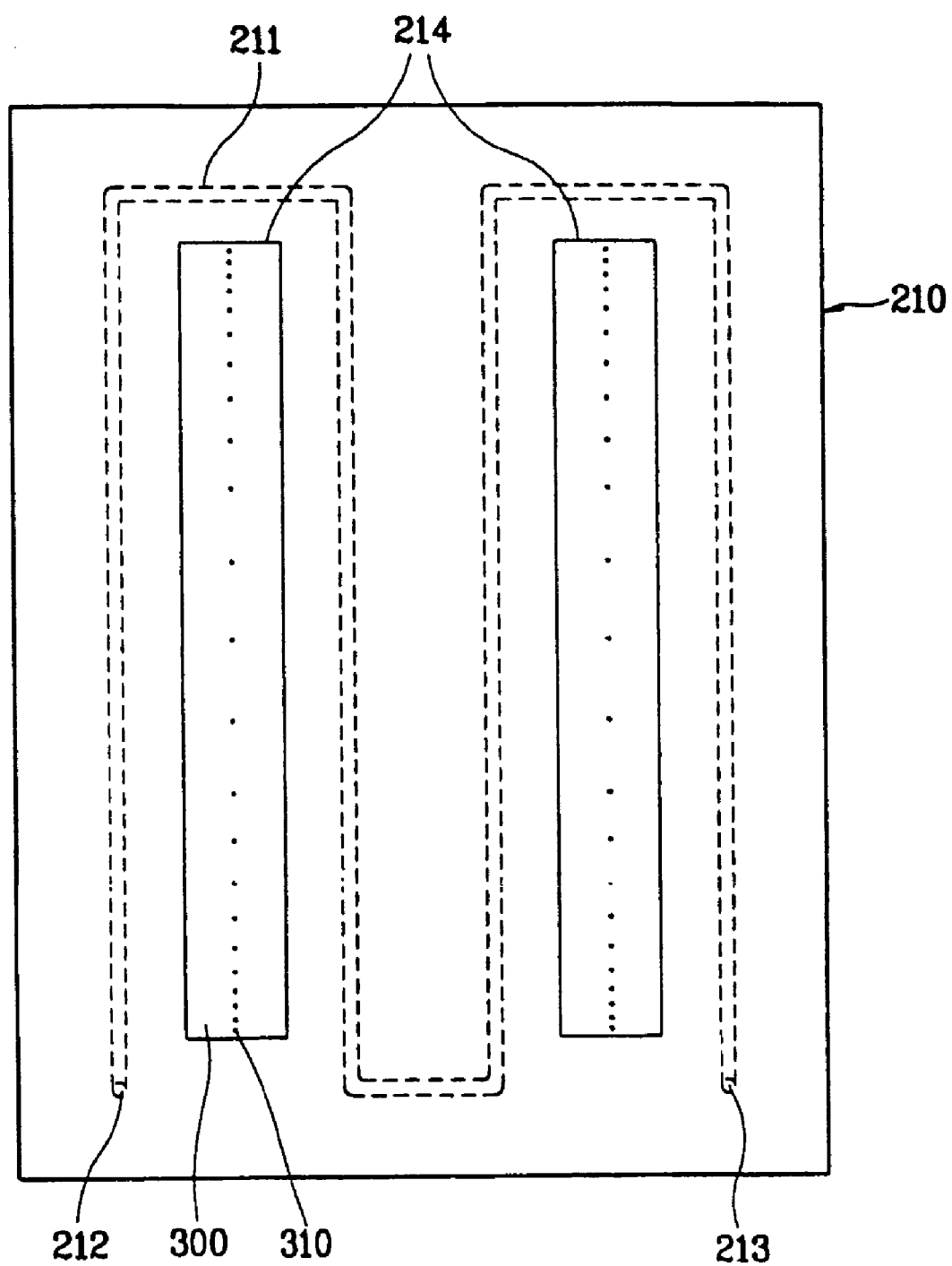
FIG. 2 is a plan view showing a cooling plate unit of the surface treatment system in FIG. 1.

FIG. 1 is a conceptual view showing a surface treatment system in accordance with a first embodiment of the present invention, and FIG. 2 is a plan view showing a cooling plate unit of the surface treatment system in FIG. 1.

As shown in FIGS. 1 and 2, the surface treatment system in accordance with the first embodiment of the present invention forms a deposition layer at the surface of an object to be surface treated 900 by using a deposition reaction, in which electrodes 110 for applying power to produce a deposition reaction in a deposition chamber 100 are installed between inner walls 120 and the object of surface treatment 900, including a cooling unit 200 installed at the inner wall 120 of the deposition chamber 100 facing the electrodes 110 and cooling the ambient environment.

The deposition reaction for the surface processing includes a chemical vapor deposition (CVD) reaction, a physical vapor deposition (PVD) reaction, or the like, and especially, the first embodiment of the present invention adopts the plasma deposition reaction as disclosed in PCT publication No. WO9927156, which is one of the conventional surface treatment methods.

Namely, in the surface treatment system in accordance with the first embodiment of the present invention, gas for the deposition reaction is injected into the deposition chamber, to which power is applied to produce the plasma deposition reaction, that is, the deposition reaction, to form a deposition layer at the surface of the object to be surface treated.

However, the deposition reaction in the first embodiment of the present invention can be adoptable to a surface treatment system, regardless of types of deposition reaction, in which a gas for the deposition reaction is injected into the deposition chamber, to which power is applied to form a deposition reaction to form a deposition layer at the surface of the object to be surface treated.

The gas injected into the deposition chamber 100 allows a desired deposition layer to be formed at the object of surface treatment 900, and as the power source, a radio frequency (RF) power source or a DC power source can be used. In addition, power may be applied to the object to be surface treated according to the deposition reaction. In particular, in case of DC power as the power source, the object of surface treatment may be one of the electrodes with a power applying device (not shown).

As the cooling unit 200, various cooling systems can be adopted, and in this respect, a water-cooling system is adopted in the first embodiment of the present invention.

That is, the cooling unit 200 includes a cooling plate unit 210 installed at the inner wall 120 of the deposition chamber 100; a heat-releasing unit 220 for releasing heat generated in the deposition chamber 100, and passages 230a and 230b for connecting the cooling plate unit 210 and the heat-releasing unit 220.

The cooling plate unit 210 includes a refrigerant passage 211 formed to let refrigerant, i.e. water to flow therein, a refrigerant inlet 212 for introducing the refrigerant into the refrigerant passage 211, and a refrigerant outlet 213 for discharging the refrigerant from the refrigerant passage 211.

The cooling plate unit 210, formed in a platy shape, can be separately installed inside the deposition chamber 100 or can be formed integrally with the inner wall 120 of the deposition chamber 100.

As shown in FIG. 2, the cooling plate unit 210 includes a plurality of slots 214. The slots 214 may have a gas injection unit 300 with gas injection holes 310 therein.

The refrigerant inlet 212 and the refrigerant outlet 213 are connected by the heat-releasing unit 220 for releasing heat generated from the deposition chamber 100 and the passages 230a and 230b.

There are provided one or more electrodes 110, which are fixedly installed at the inner wall 120 or at the cooling plate unit 210 of the deposition chamber 100 by means of an engaging unit (not shown). An insulation member 111 is interposed between the electrode 110 and the inner wall 120 or the cooling plate unit 210 to insulate the electrode 110.

Reference numeral 350 denotes a gas outlet and is installed at an upper portion of the deposition chamber 100.

In the surface treatment system of the present invention, two deposition spaces can be formed at the central portion of the deposition chamber.

Figure 3:
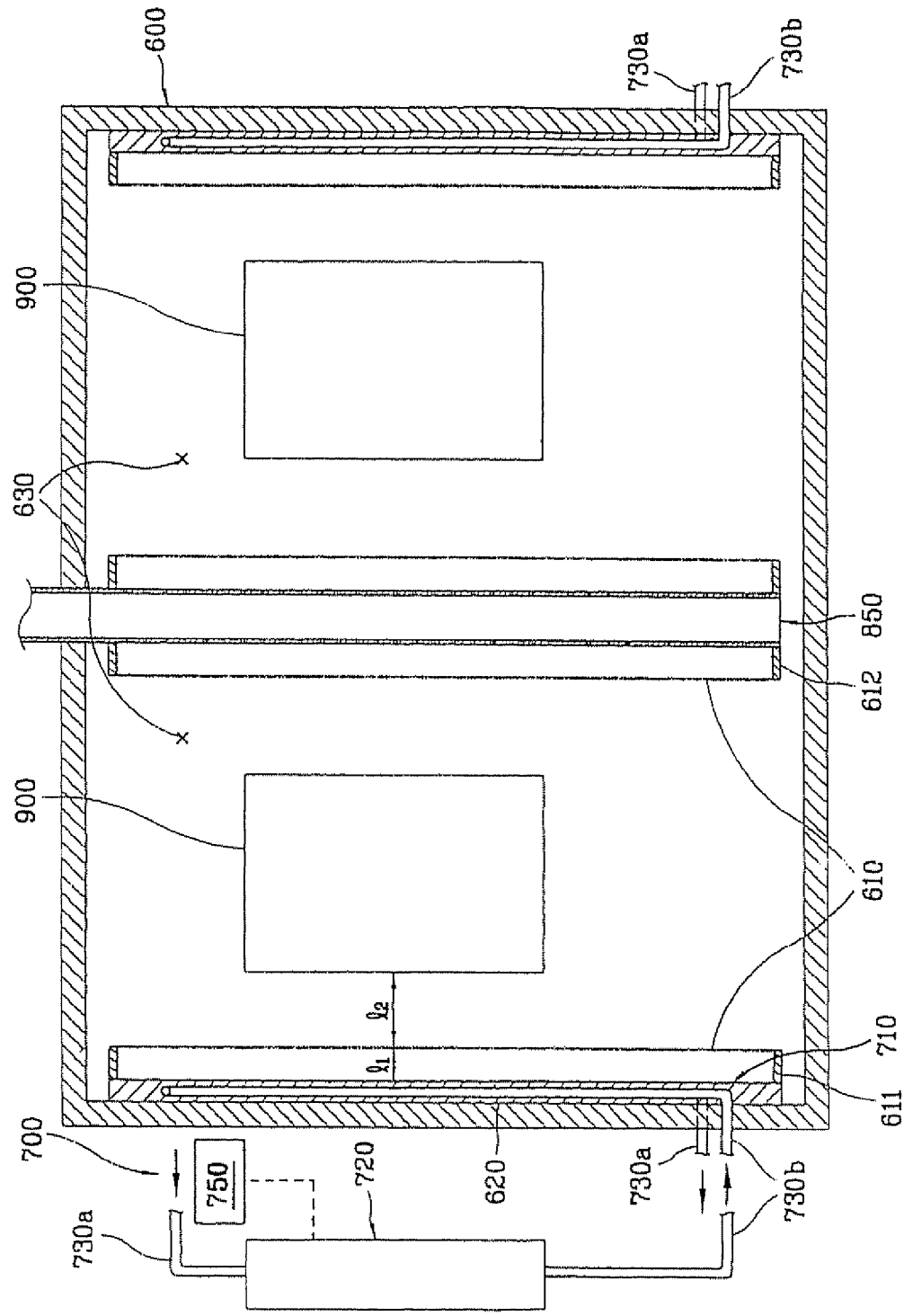
FIG. 3 is a conceptual view showing a surface treatment system in accordance with the second embodiment of the present invention.
Figure 4:
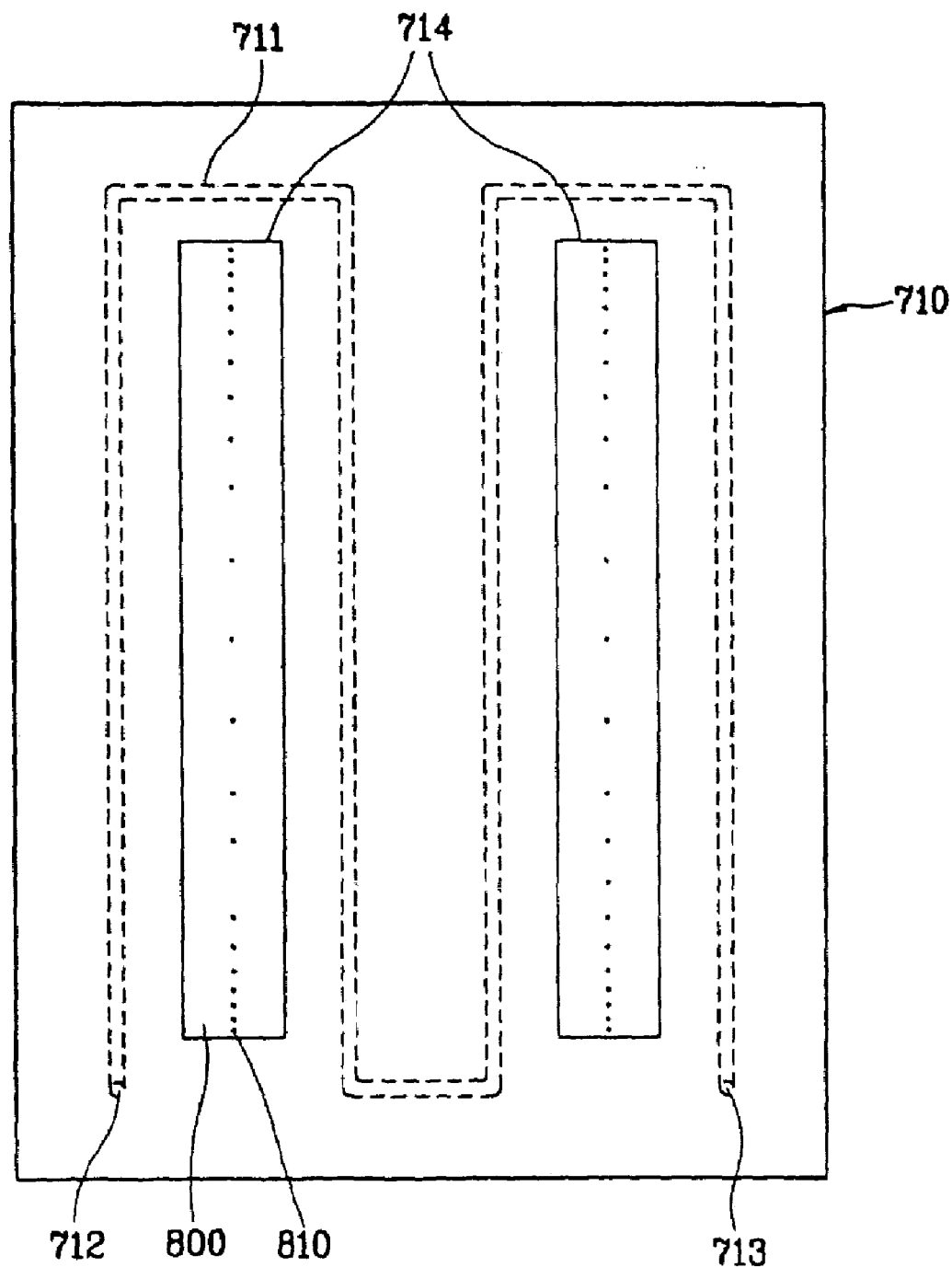
FIG. 4 is a plan view showing a cooling plate unit of the surface treatment system in accordance with the second embodiment of the present invention.

FIG. 3 is a conceptual view showing a surface treatment system in accordance with the second embodiment of the present invention, and FIG. 4 is a plan view showing a cooling plate unit of the surface treatment system in accordance with the second embodiment of the present invention.

As shown in FIGS. 3 and 4, a surface treatment system in accordance with the second embodiment of the present invention, in which gas for a deposition reaction is injected into a deposition chamber 600, to which power is applied to form deposition reaction to form a deposition layer at the surface of the object to be surface treated 900, includes a gas injection unit 800 installed at both sides of the deposition chamber 600 for injecting gas for a deposition reaction into the deposition chamber 600; a gas discharging unit 850 installed at the central portion of the deposition chamber 600 to form two deposition spaces 630 and discharging deposition reaction-finished gas from the deposition chamber 600, a plurality of electrodes 610 installed within each deposition space 630 therebetween for applying power into the deposition chamber 600; and a cooling unit 700 installed at both sides of the deposition chamber 600 for cooling the ambient environment.

Like the first embodiment, the surface treatment system in accordance with the second embodiment of the present invention is the plasma deposition reaction as disclosed in PCT publication No. WO9927156, one of the conventional surface treatment methods.

However, the deposition reaction in the second embodiment of the present invention also can be adoptable to a surface treatment system, regardless of types of deposition reaction, in which gas for a deposition reaction is injected into the deposition chamber, to which power is applied to cause a deposition reaction to form a deposition layer at the surface of the object to be surface treated.

The gas injected into the deposition chamber 600 allows a desired deposition layer to be formed at the object of surface to be treated 900, and as the power source, a radio frequency (RF) power source or a DC power source can be used. In addition, power may be applied to the object to be surface treated according to the deposition reaction. In particular, in the case of DC power as the power source, the object of the surface treatment may be one of the electrodes with a power applying device (not shown).

As the cooling unit 700, various cooling systems can be adopted, and in this respect, a water-cooling system is adopted in the second embodiment of the present invention.

That is, the cooling unit 700 includes a cooling plate unit 710 installed at the inner wall 620 of the deposition chamber 600; a heat-releasing unit 720 for releasing heat generated in the deposition chamber 600, and passages 730a and 730b connecting the cooling plate unit 710 and the heat-releasing unit 720.

The cooling plate unit 710 includes a refrigerant passage 711 formed to let refrigerant, i.e. water to flow therein, a refrigerant inlet 712 for introducing the refrigerant into the refrigerant passage 711, and a refrigerant outlet 713 for discharging the refrigerant from the refrigerant passage 711.

The cooling plate unit 710, formed in a platy shape, can be separately installed inside the deposition chamber 600 or can be formed integrally with the inner wall 620 of the deposition chamber 600.

As shown in FIG. 4, the cooling plate unit 710 includes a plurality of slots 714. The slot 714 may have a gas injection unit 800 with gas injection holes 810 therein.

The refrigerant inlet 712 and the refrigerant outlet 713 are connected by the heat-releasing unit 720 for releasing heat generated from the deposition chamber 600 and the passages 730a and 730b.

There are provided one or more electrodes 610, which are fixedly installed at the inner wall 620, at the cooling plate unit 710 or at the gas discharge unit 850 of the deposition chamber 600 by means of an engaging unit (not shown). Insulation members 611 and 612 are interposed between the electrode 610 and the inner wall 620, the cooling plate unit 710 or the gas discharge unit 850, for insulation of the electrode 610.

The operation of the surface treatment system in accordance with the first and second embodiment of the present invention will now be described.

First, the object to be surface treated 900 is provided in the deposition chambers 100 and 600 through an open and shut unit (not shown) of the deposition chambers 100 and 600 by means of a conveying unit (not shown).

After the object to be surface treated 900 is conveyed into the deposition chambers 100 and 600, the open and shut unit (not shown) closes and seals the deposition chambers 100 and 600, and then a gas for the deposition reaction is injected into the deposition chambers 100 and 600 through the gas injection units 300 and 800.

With gas being injected, power is applied to the deposition chambers 100 and 600 through electrodes 110 and 610, or to the object to be surface treated 900, whereby the deposition reaction takes place to form a deposition layer at the surface of the object 900. At this time, the deposition reaction-depleted gas is discharged outwardly through the gas outlets 350 and 850.

The surface of the object 900 has the deposition layer formed thereon and after the deposition reaction, the spent gas is discharged outwardly through the open and shut unit (not shown) by means of the convey unit (not shown).

Meanwhile, in the deposition chambers 100 and 600, as the deposition reaction takes place, each of the cooling units 200 and 700 starts its operation under the control of control units 250 and 750, respectively, to cool the ambient of the cooling plate units 210 and 710.

A strong electric field is generated around the electrodes 110 and 610 according to the power supplied thereto to form the deposition reaction, such as a plasma deposition reaction. The distance from each electrode 110 and the temperature determine the direction of the deposition reaction.

Therefore, in fabricating the deposition chamber 100, a distance ($l_1$) between the inner wall of the deposition chamber 100 and the electrode 110 depends on a distance ($l_2$) between the object to be surface treated 900 and the electrode 110, and in order to surface-process a larger object of surface treatment, the deposition chamber 100 should be increased in its size.

In order to avoid such increase of the deposition chamber 100, the surface treatment system of the present invention includes the cooling unit 200, 700 to cool the ambient environment in order to turn the direction of the deposition reaction to the object of surface treatment 900 and narrow the distance between the inner wall of the deposition chamber 100 and the electrode 110.

In addition, the gas injection unit is also installed together with the cooling unit 200 so that gas is cooled while passing the cooling unit and injected into the deposition chamber 100, thereby dropping down the temperature between the electrode 110 and the inner wall of the deposition chamber 100.

As so far described, the surface treatment system of the present invention has the following advantages.

By installing the cooling unit at both sides of the deposition chamber to cool the ambient environment, the distance between the electrode and the inner wall of the deposition chamber is reduced, and thus, a space taken up by the deposition chamber can be reduced.

In addition, by installing the gas injection unit together with the cooling unit, a cooling effect to the flow of gas injected into the deposition space can be increased.

It will be apparent to those skilled in the art that various modifications and variations can be made in the surface treatment system and method of the present invention without departing from the spirit or scope of the invention. Thus, it is intended that the present invention cover modifications and variations of this invention provided they come within the scope of the appended claims and their equivalents.

The invention claimed is:

1. A surface treatment system for forming a deposition layer at a surface of an object, comprising:
   a deposition chamber having an inner vertical wall;
   a gas injection unit for injecting a gas for a deposition reaction in the deposition chamber;
   an electrode unit substantially parallel to the inner vertical wall for applying power to form a deposition reaction in the deposition chamber, said electrode unit being installed between the inner vertical wall of the deposition chamber and the object,
   a cooling unit adapted to contain a refrigerant and disposed against the inner vertical wall of the deposition chamber and adjacent to a side of the electrode for cooling the injected gas with the refrigerant contained within the cooling unit for dropping the temperature between the inner vertical wall and the electrode unit,
   wherein the cooling unit includes a cooling plate installed against the inner vertical wall of the deposition chamber, the cooling plate includes a plurality of slots for receiving the gas injection unit, and a refrigerant passage of the cooling unit extends within the cooling plate and around a periphery of the slots; and
   a control unit for operating the cooling unit,
   wherein the cooling unit further comprises:
   a heat exchanger operatively connected to the cooling plate for releasing heat generated in the deposition chamber and absorbed by the cooling plate.

2. The system according to claim 1, wherein the refrigerant of the cooling unit is water and further comprising means for maintaining the refrigerant at a temperature below a temperature of the interior of the deposition chamber.

3. The system according to claim 1, wherein the cooling plate is installed integrally with the inner wall of the deposition chamber and facing the electrode.

4. The system according to claim 1, further comprising a gas injection unit for injecting gas for a deposition reaction installed integrally with the cooling plate in the deposition chamber.

5. The system according to claim 1, wherein the cooling plate comprises:

the refrigerant passage containing the refrigerant;
a refrigerant inlet through which the refrigerant is introduced into the refrigerant passage; and
a refrigerant outlet through which the refrigerant is discharged from the refrigerant passage, the refrigerant inlet and the refrigerant outlet being operatively connected to the heat exchanger.

6. A surface treatment system for forming a deposition layer at a surface of an object, comprising:
a deposition chamber having an inner vertical wall and a horizontal wall and forming a deposition space;
a pair of gas injection units installed at least two sides of the inner vertical wall of the deposition chamber for injecting gas for a deposition reaction within the deposition space;
a gas discharge unit disposed at a center of the horizontal wall of the deposition chamber and dividing the deposition space into two deposition areas for discharging a deposition reaction-spent gas outwardly away from the deposition chamber;
a plurality of electrodes installed within the deposition space adjacent and substantially parallel to the inner vertical wall for applying power to the deposition chamber;
a first cooling unit and a second cooling unit respectively installed against the inner vertical wall at two sides of the deposition chamber for cooling the ambient and dropping the temperature between the inner vertical wall and the electrode units, wherein two of the electrodes are positioned to be adjacent to the first cooling unit and the second cooling unit, respectively; and
a control unit for operating the first and second cooling units,
wherein the first and second cooling units each include:
a cooling plate installed against an inner wall of the deposition chamber; and
a heat exchanger operatively connected to the cooling plate for releasing heat generated in the deposition chamber and absorbed by the cooling plate.

7. The system according to claim 6, wherein the cooling plate is installed integrally with the inner wall of the deposition chamber and in contact with a side of the respective electrode.

8. The system according to claim 6, wherein the gas injection unit is installed integrally with the cooling plate.

9. The system according to claim 6, wherein the cooling plate comprises:
a refrigerant passage containing a refrigerant;
a refrigerant inlet through which the refrigerant is introduced into the refrigerant passage; and
a refrigerant outlet through which the refrigerant is discharged from the refrigerant passage, the refrigerant inlet and the refrigerant outlet being operatively connected to the heat exchanger.

10. The system according to claim 9, wherein the cooling plate includes a plurality of slots for receiving the gas injection unit, and the refrigerant passage extends within the cooling plate and around a periphery of the slots.

11. The system according to claim 6, wherein the refrigerant of the cooling unit is water and further comprising means for maintaining the refrigerant at a temperature below a temperature of the interior of the deposition chamber.

12. A surface treatment system for forming a deposition layer at a surface of an object, comprising:
a deposition chamber having an interior inner vertical wall;
an electrode unit for applying power to form a deposition reaction in the deposition chamber, said electrode unit being installed substantially parallel to the inner vertical wall and between the inner vertical wall of the deposition chamber and the object,
a cooling unit disposed against the inner wall of the deposition chamber and adjacent to a side of the electrode, said cooling unit cooling the electrode with a refrigerant contained within the cooling unit,
wherein the cooling unit further comprises:
a cooling plate installed against an inner wall of the deposition chamber; and
a heat exchanger operatively connected to the cooling plate for releasing heat generated in the deposition chamber and absorbed by the cooling plate,
wherein the cooling plate includes a plurality of slots, and the refrigerant passage extends within the cooling plate and around a periphery of the slots,
a gas injection unit for injecting gas for a deposition reaction installed in the slots of the cooling plate in the deposition chamber,
a gas outlet formed in an upper surface of the deposition chamber; and
a control unit for operating the cooling unit,
wherein the cooling unit cools the injected gas for dropping the temperature between the inner vertical wall and the electrode unit,
wherein the refrigerant of the cooling unit is water and further comprising means for maintaining the refrigerant at a temperature below a temperature of the interior of the deposition chamber.

* * * * *